United States Patent
Hsiao et al.

(10) Patent No.: US 9,543,399 B2
(45) Date of Patent: Jan. 10, 2017

(54) DEVICE HAVING SLOPED GATE PROFILE AND METHOD OF MANUFACTURE

(71) Applicant: Taiwan Semiconductor Manufacturing Company, Ltd., Hsin-Chu (TW)

(72) Inventors: Ru-Shang Hsiao, Jhubei (TW); Ling-Sung Wang, Tainan (TW); Chih-Mu Huang, Tainan (TW); Yao-Tsung Chen, Kaohsiung (TW); Ming-Tsang Tsai, Kaohsiung (TW); Kuan-Yu Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 46 days.

(21) Appl. No.: 14/245,795

(22) Filed: Apr. 4, 2014

(65) Prior Publication Data

US 2015/0287798 A1 Oct. 8, 2015

(51) Int. Cl.

| | |
|---|---|
| *H01L 21/4763* | (2006.01) |
| *H01L 29/423* | (2006.01) |
| *H01L 29/78* | (2006.01) |
| *H01L 29/66* | (2006.01) |
| *H01L 29/51* | (2006.01) |
| *H01L 29/40* | (2006.01) |
| *H01L 29/49* | (2006.01) |

(52) U.S. Cl.
CPC ....... *H01L 29/42376* (2013.01); *H01L 29/401* (2013.01); *H01L 29/512* (2013.01); *H01L 29/513* (2013.01); *H01L 29/518* (2013.01); *H01L 29/6656* (2013.01); *H01L 29/66545* (2013.01); *H01L 29/78* (2013.01); *H01L 29/7833* (2013.01); *H01L 29/4966* (2013.01); *H01L 29/517* (2013.01)

(58) Field of Classification Search
CPC .............................................. H01L 21/823807
See application file for complete search history.

(56) References Cited

U.S. PATENT DOCUMENTS

| | | | |
|---|---|---|---|
| 2005/0090066 A1* | 4/2005 | Zhu | H01L 21/84 438/300 |
| 2013/0234241 A1* | 9/2013 | Bowers | H01L 29/407 257/330 |
| 2014/0057427 A1* | 2/2014 | Kim | H01L 21/28114 438/595 |

OTHER PUBLICATIONS

Kumar et al., (Characterization of Plasma Etching for semiconductor Applications; Motorola Semiconductor, Inc.).*

(Continued)

*Primary Examiner* — Telly Green
*Assistant Examiner* — Andre' C Stevenson
(74) *Attorney, Agent, or Firm* — Slater Matsil, LLP

(57) ABSTRACT

A semiconductor device having an open profile gate electrode, and a method of manufacture, are provided. A funnel-shaped opening is formed in a dielectric layer and a gate electrode is formed in the funnel-shaped opening, thereby providing a gate electrode having an open profile. In some embodiments, first and second gate spacers are formed alongside a dummy gate electrode. The dummy gate electrode is removed and upper portions of the first and second gate spacers are removed. The first and second gate spacers may be formed of different materials having different etch rates.

21 Claims, 3 Drawing Sheets

(56) References Cited

OTHER PUBLICATIONS

Rakesh Kumanr and Chris Ladas, "Characterization of Plasma Etching ofr semiconductor Applications", Motorola Semiconductor, Inc, 1975.*

* cited by examiner

DEVICE HAVING SLOPED GATE PROFILE AND METHOD OF MANUFACTURE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
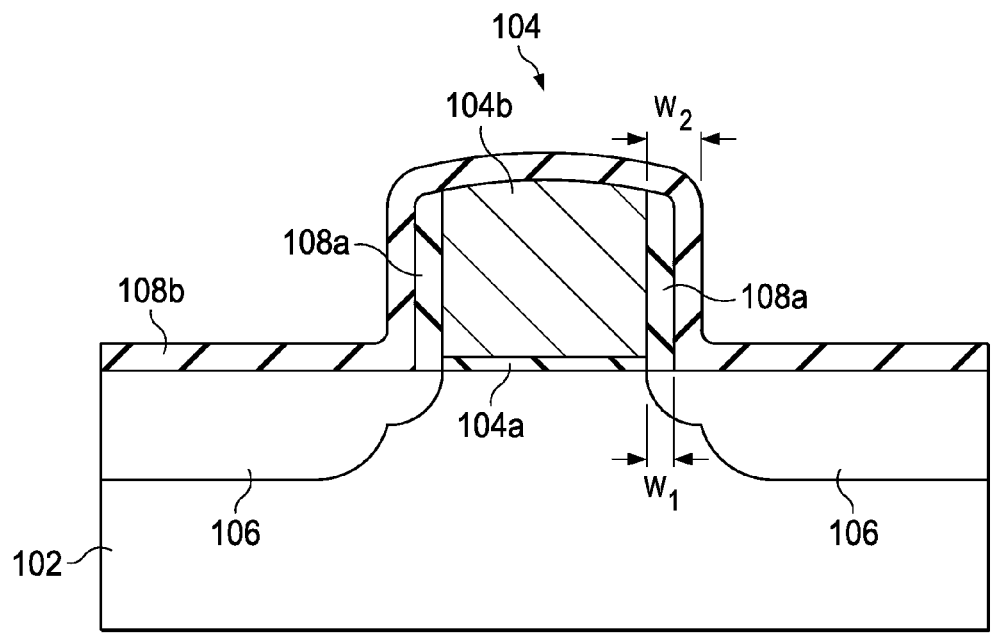
FIGS. 1-5 illustrate various intermediate stages of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are discussed below with reference to forming a gate electrode using a gate-last approach for illustrative purposes. Generally, a dummy gate electrode having gate spacers formed along sidewalls of the dummy gate electrode is formed. The dummy gate electrode is removed and a process is performed to widen an upper portion of the opening formed by the removal of the dummy gate electrode, thereby forming a funnel-shaped opening. The gate electrode is formed in the funnel-shaped opening, thereby providing a gate electrode having an open profile. The funnel-shaped opening reduces or prevents voids that may occur during the formation of the gate electrode. Other embodiments may utilize other processes to form the open profile gate electrode.

FIGS. 1-5 illustrate various intermediate stages of an embodiment of forming a gate electrode in accordance with some embodiments. Referring first to FIG. 1, there is shown a substrate 102 having a dummy gate stack 104 formed thereon. The substrate 102 may comprise, for example, bulk silicon, doped or undoped, or an active layer of a semiconductor-on-insulator (SOI) substrate. Generally, an SOI substrate comprises a layer of a semiconductor material, such as silicon, silicon germanium, silicon carbide, or the like, formed on an insulator layer. The insulator layer may be, for example, a buried oxide (BOX) layer or a silicon oxide layer. The insulator layer is provided on a substrate, typically a silicon substrate or glass substrate. Other substrates, such as multi-layered or gradient substrates may also be used.

As discussed in greater detail below, the dummy gate stack 104 is a sacrificial structure used to align and form source/drain regions 106 adjacent to the dummy gate stack 104 and will be replaced in subsequent processing steps. As such, the dummy gate stack 104 may be formed of any suitable material and processes. In some embodiments, the dummy gate stack 104 is formed simultaneously as other devices on the wafer, such as other transistors. In these embodiments, it may be desirable to form the dummy gate stack 104 from a dummy gate dielectric 104*a* and a dummy gate electrode 104*b*, which layers may be used to form functional gate stacks for other devices.

The source/drain regions 106 may include any appropriate doping profile for a particular application. For example, the source/drain regions 106 may include lightly-doped source/drain (LDD) regions formed by implanting dopants, e.g., n-type dopants or p-type dopants, using the dummy gate stack 104 as a mask, thereby aligning the LDD regions with the edges of dummy gate stack 104. Halo and/or pocket regions (not shown) may also be formed.

FIG. 1 further illustrates the formation of one or more spacers 108 in accordance with an embodiment. FIG. 1 illustrates an embodiment in which the spacers 108 include first gate spacers 108*a* and second gate spacers 108*b* (collectively referred to as "spacers 108") along sidewalls of the dummy gate stack 104. The second gate spacers 108*b* may also act as a contact etch stop layer (CESL) during formation of contacts through a subsequently formed interlayer dielectric film.

As explained in greater detail below, the spacers 108 will be etched to form a funnel-shaped opening during the removal of the dummy gate stack 104, thereby allowing an open-profile gate electrode. As such, in some embodiments the materials selected to form the spacers, e.g., the first gate spacers 108a and the second gate spacers 108b, are selected to maintain an etch selectivity that results in a desired funnel shape.

For example, in some embodiments the first gate spacers 108a are formed of a silicon oxide, and the second gate spacers 108b are formed of a silicon nitride. The first gate spacers 108a may be formed by forming a conformal layer of silicon oxide and performing an anisotropic etch to remove the dielectric material other than that dielectric material adjacent the dummy gate stack 104. The second gate spacers 108b may be formed by depositing a conformal layer of silicon nitride.

The source/drain regions 106 may further include highly-doped source/drain regions formed by implanting dopants, e.g., n-type dopants or p-type dopants, using the dummy gate stack 104, the first gate spacers 108a, and the second gate spacers 108b as a mask, thereby aligning the highly-doped source/drain regions 106 with the edges of the second gate spacers 108b.

The structure provided above is for illustrative purposes only and other embodiments may utilize other structures and features. For example, some embodiments may incorporate silicide regions, buried stressors, recessed source/drain regions filled with a stressor, raised source/drain regions, different materials, different gate structure and materials, halo implants, different source/drain doping profiles, and the like.

Figure 2:
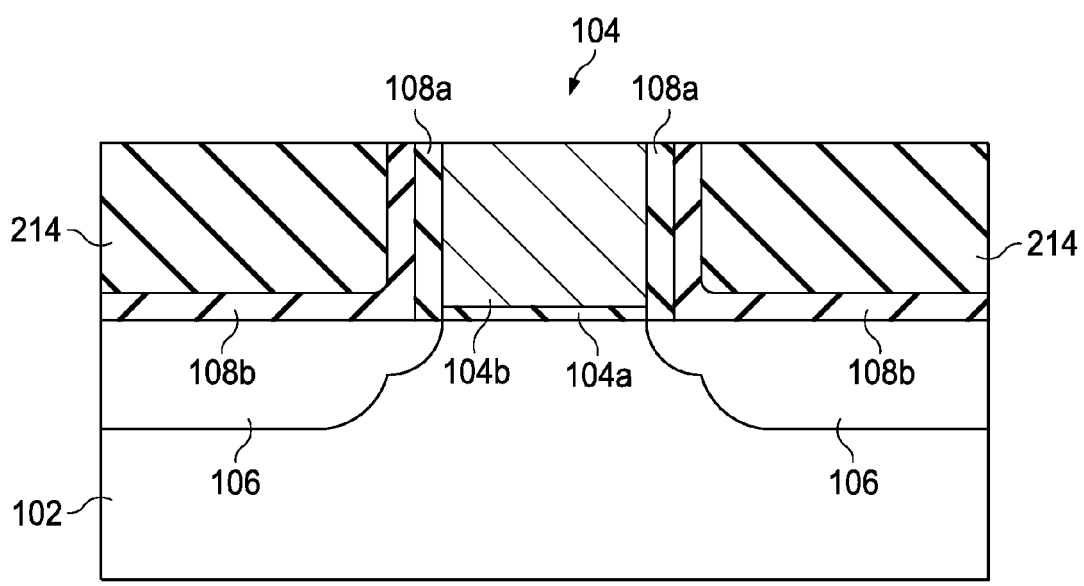

Referring to FIG. 2, a first inter-layer dielectric (ILD) layer 214 is formed in accordance with some embodiments. The first ILD layer 214 may be formed, for example, of a low-K dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). The first ILD layer 214 may comprise a plurality of dielectric layers.

The first ILD layer 214 over the dummy gate stack 104 is removed, exposing the dummy gate stack 104. In some embodiments, a chemical mechanical polishing (CMP) process is used to planarize an upper surface of the first ILD layer 214 level with an upper surface of the dummy gate stack 104 as illustrated in FIG. 2.

Figure 3:
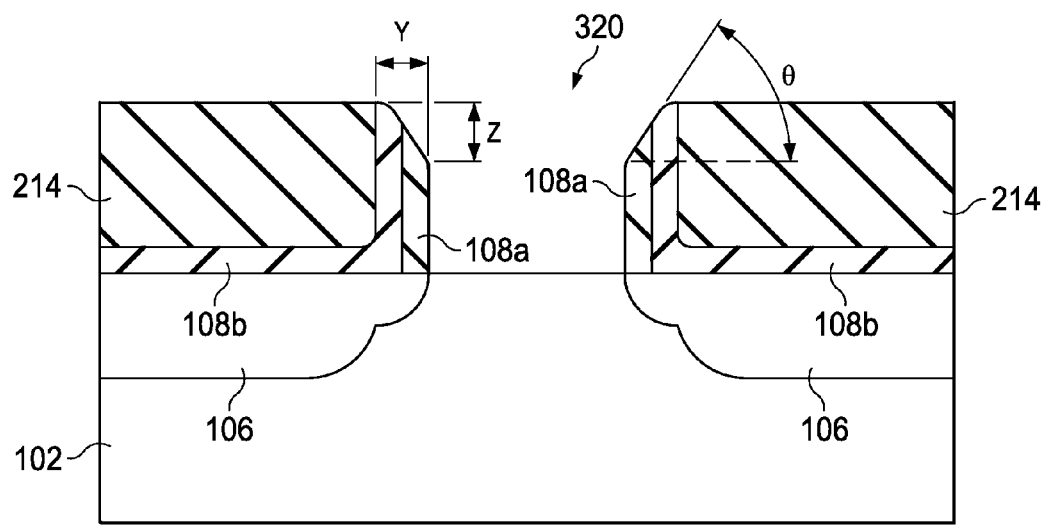

FIG. 3 illustrates the selective removal of the dummy gate stack 104 (see FIG. 2) and formation of a funnel-shaped opening 320 in accordance with some embodiments. As will be explained in greater detail below, the funnel-shaped opening 320 will be subsequently filled with gate electrode material. It has been found that a funnel-shaped opening such as that described herein reduces or prevents voids that may occur during formation of the gate electrode as compared with a gate electrode formed with a more perpendicular sidewall.

One or more etch processes may be performed to remove the dummy gate stack 104 and form the funnel-shaped opening 320. For example, in embodiments in which the dummy gate stack 104 is a polysilicon material, the first gate spacers 108a are formed of a silicon oxide, and the second gate spacers 108b are formed of a silicon nitride, two etch processes may be used, with the first etch process being used to recess the dummy gate stack 104 and the spacers 108. The first etch process is followed by a second etch process that removes the dummy gate stack 104 at a faster rate than the spacers.

As a further example, in some embodiments the first etch process exhibits a ratio of the etch rate of the dummy gate stack 104 to the etch rate of the spacers 108 from about 1.2 to about 1.5. This ratio results in the dummy gate stack 104 being removed at a higher rate that the spacer 108 while allowing upper portions of the spacers to be removed, thereby providing the funnel-shaped opening. The first etch process may be, for example, a dry etch process using a process gas such as $CF_4$, $CHF_3$, or the like, or combinations thereof. A diluting gas such as $N_2$, $O_2$, or Ar may optionally be used.

In some embodiments, the second etch process exhibits a ration of the etch rate of the dummy gate stack 104 to the etch rate of the spacers 108 of about 1000:1. The first etch process may be, for example, a dry etch process using a process gas such as $Cl_2$, HBr, or the like, or combinations thereof. A diluting gas such as $N_2$, $O_2$, or Ar may optionally be used.

In some embodiments, the funnel-shaped opening 320 has a funnel slope θ from about 30° to about 45° relative to a major surface of the substrate 102 as illustrated in FIG. 3. Furthermore, in some embodiments a funnel portion of the funnel-shaped opening 320 may have a horizontal offset Y of about 4.5 nm to about 5 nm, and have a vertical offset Z of about 4.5 nm to about 5 nm.

A shape of the funnel-shaped opening 320 may be controlled by, for example, controlling thicknesses of the first gate spacer 108a and the second gate spacer 108b, and selecting materials and etch processes that etch the different materials at the desired rate. For example, a narrow funnel portion may be obtained by forming a relatively thin first spacer layer 108a and selecting materials such that the etch rate of the second spacer layer 108b is relatively low as compared to the first spacer layer 108a. As another example, a wide funnel portion may be obtained by forming a relatively thick first spacer layer 108a. A wide funnel portion may further be obtained by selecting materials for the first spacer layer 108a and the second spacer layer 108b and selecting etchants that will etch the first spacer layer 108a and the second spacer layer 108b at a more similar etch rate.

Figure 4:
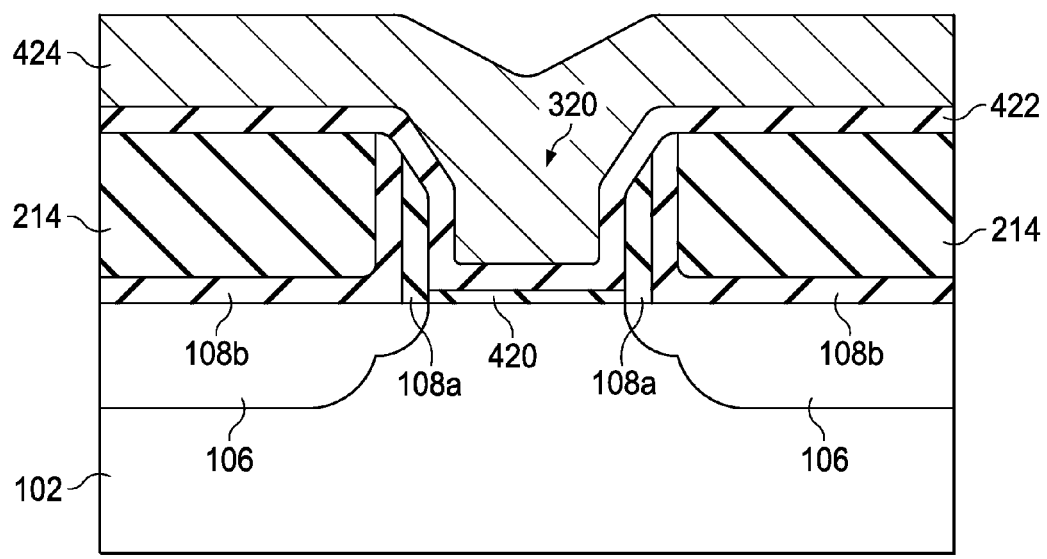

FIG. 4 illustrates formation of an interfacial layer 420 formed along a surface of the substrate in the opening 320 in accordance with some embodiments. The interfacial layer 420 helps buffer the substrate 102 and a subsequently formed high-k dielectric layer. In some embodiments, the interfacial layer 420 is a chemical silicon oxide, which may be formed of chemical reactions. For example, a chemical oxide may be formed using deionized water+ozone ($DIO_3$), $NH_4OH+H_2O_2+H_2O$ (APM), or other methods. Other embodiments may utilize a different material or processes for the interfacial layer 420.

A gate dielectric layer 422 is formed on the interfacial layer 420. In an embodiment, the gate dielectric layer 422 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, and the like. The formation methods of gate dielectric layer 422 include molecular-beam deposition (MBD), atomic layer deposition (ALD), physical vapor deposition (PVD), and the like.

FIG. 4 further illustrates a gate electrode layer 424 formed over the gate dielectric layer 422. In some embodiments, the gate electrode layer 424 is formed of tantalum or titanium containing materials such as TaC, TaN, TiN, TaAlN, TaSiN, and combinations thereof. These metal-containing materials may be in the form of metal carbides, metal nitrides, or conductive metal oxides. Other embodiments may utilize other types of metals, such as W, Cu, Ti, Ag, Al, TiAl, TiAlN, TaCN, TaSiN, Mn, WN, Ru, and Zr. The formation methods of the gate electrode layer 424 include ALD, PVD, metal-organic chemical vapor deposition (MOCVD), and the like.

FIG. 4 illustrates a gate electrode layer 424 having a single metal layer for illustrative purposes only and may include two or more layers for a composite gate structure. For example, the gate electrode layer 424 may be adjusted to exhibit a work function suitable to the type of device being formed, e.g., a PMOS device or an NMOS device. Generally, it may be desirable to adjust the work function of the gate electrode to the band-edge of the silicon; that is, for an NMOS device, adjusting the work function close to the conduction band, and for a PMOS device, adjusting the work function close to the valence band. In some embodiments, multiple layers may be used to adjust the work function and other operating characteristics of the device.

Figure 5:
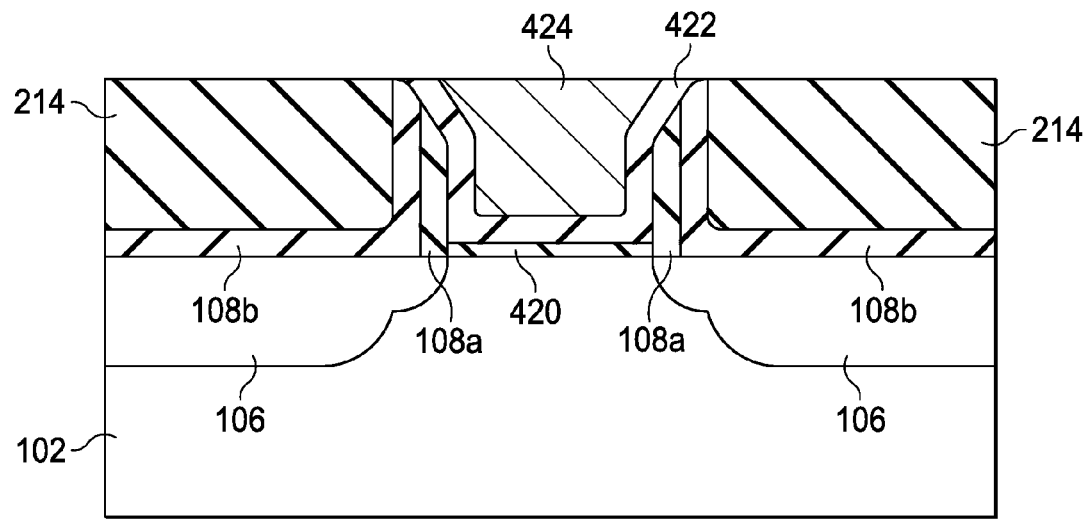

FIG. 5 illustrates results of removing excess materials of the interfacial layer 420, gate dielectric layer 422, and the gate electrode layer 424 using, for example a CMP process.

Thereafter, further processing may be performed. For example, a second ILD layer may be formed over the first ILD layer, metallization layers including conductive lines, vias, and dielectric layers may be formed, passivation and contact structures may be formed, and singulation and/or packaging processes may be performed.

Figure 6:
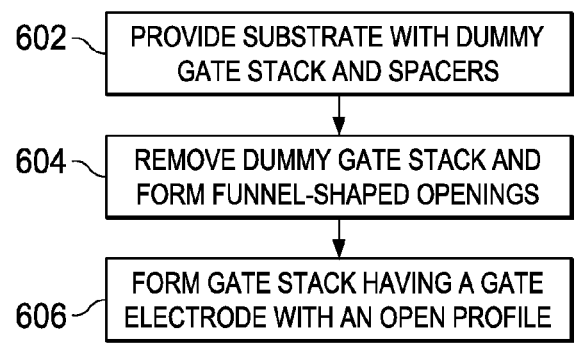
FIG. 6 is a flow diagram illustrating a method of forming a semiconductor device, in accordance with some embodiments.

FIG. 6 is a flow diagram illustrating process steps to form an open profile gate electrode in accordance with some embodiments. The process begins in step 602, wherein a substrate is provided with a dummy gate stack formed thereon. The dummy gate stack has spacers formed along sidewalls of the dummy gate stack. The spacers may include one or more spacer layers. For example, in an embodiment, the spacer layers include a plurality of dielectric layers having different etch rates, such as a silicon oxide layer and a silicon nitride layer. Additionally, an ILD layer may be formed over the dummy gate stack and planarized to expose an upper surface of the gate stack.

In step 604, the dummy gate stack is removed and a funnel-shaped opening is formed. In an embodiment, the etch process uses a dry etch such that the spacer layers etch at different rates. As a result of the different etch rates, a funnel-shaped opening may be created.

Thereafter, in step 606, a gate stack may be formed in the funnel-shaped opening, thereby forming a gate electrode having an open profile. The gate stack may include, for example, an interfacial layer, a gate dielectric layer, and a gate electrode. In some embodiments, the gate electrode includes one or more metal layers, and may include a metal work function layer.

In an embodiment, a method of forming a semiconductor device is provided. The method includes providing a substrate and forming a gate stack and gate spacers adjacent the gate stack. A first dielectric layer is formed over the substrate adjacent the gate spacers. The gate stack and upper portions of the gate spacers are removed, thereby forming a funnel-shaped opening. A gate electrode is subsequently formed in the funnel-shaped opening.

In another embodiment, another method of forming a semiconductor device is provided. The method includes providing a substrate, wherein the substrate has a dummy gate stack formed thereon with one or more first dielectric layers along sidewalls of the dummy gate stack. The gate stack and at least a portion of the one or more first dielectric layers are removed, thereby forming a funnel-shaped opening. A gate electrode is subsequently formed in the funnel-shaped opening.

In yet another embodiment, a semiconductor device is provided. The semiconductor device includes a substrate. The substrate has an overlying dielectric layer, wherein the dielectric layer has a funnel-shaped opening. A gate electrode is positioned in the funnel-shaped opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising: providing a substrate forming a gate stack and gate spacers adjacent the gate stack; forming a first dielectric layer over the substrate adjacent the gate spacers; removing the gate stack and upper portions of the gate spacers, thereby forming a funnel-shaped opening, the funnel-shaped opening exposing a semiconductor material of the substrate between the gate spacers; and forming a gate electrode in the funnel-shaped opening, wherein the funnel shaped opening comprises a funnel slope of about 30° to about 45° relative to a major surface of the substrate.

2. The method of claim 1, wherein the forming the gate stack and the gate spacers comprises forming a first dielectric spacer adjacent the gate stack and a second dielectric spacer adjacent the first dielectric spacer, the first dielectric spacer being formed of a different material than the second dielectric spacer.

3. The method of claim 2, wherein the first dielectric spacer has a different etch rate than the second dielectric spacer.

4. The method of claim 2, wherein the first dielectric spacer comprises a silicon oxide and the second dielectric spacer comprises a silicon nitride.

5. The method of claim 1, wherein the removing comprises:
performing a first etch process having a first ratio of an etch rate of the gate stack to an etch rate of the gate spacers; and
performing a second etch process having a second ratio of an etch rate of the gate stack to an etch rate of the gate spacers, the second ratio being greater than the first ratio.

6. The method of claim 5, wherein the first ratio is from about 1.2 to about 1.5.

7. A method of forming a semiconductor device, the method comprising: providing a substrate, the substrate having a dummy gate stack formed thereon with one or more first dielectric layers along opposing sidewalls of the dummy gate stack; removing the dummy gate stack between the one or more first dielectric layers along opposing sidewalls of the dummy gate stack and at least a portion of the one or more first dielectric layers and exposing the substrate, thereby forming a funnel-shaped opening, wherein the funnel-shaped opening comprises forming a funnel slope of about 30° to about 45° relative to a major surface of the substrate; and forming a gate electrode in the funnel-shaped opening.

8. The method of claim 7, wherein the removing comprises:
performing a first etch process, the first etch process removing the one or more first dielectric layers at a first rate; and
performing a second etch process, the second etch process removing the one or more first dielectric layers at a second rate, the first rate being greater than the second rate.

9. The method of claim 7, wherein the providing the substrate having the dummy gate stack formed thereon with one or more first dielectric layers along sidewalls of the dummy gate stack comprises forming at least two dielectric layers, wherein the at least two dielectric layers have different etch rates.

10. The method of claim 9, wherein the at least two dielectric layers comprises a first dielectric spacer formed of a silicon oxide and a second dielectric spacer formed of a silicon nitride.

11. The method of claim 10, wherein a funnel portion the funnel-shaped opening extends about 4.5 nm to about 5 nm from an upper surface of the gate electrode.

12. The method of claim 7, wherein an upper portion the funnel-shaped opening extends about 4.5 nm to about 5 nm laterally from a lower portion of the funnel-shaped opening.

13. A method of forming a semiconductor device, the method comprising: providing a substrate; forming a gate stack on the substrate; forming a first dielectric layer on a first side of the gate stack and a second dielectric layer on a second side of the gate stack; removing the gate stack and upper portions of the first dielectric layer and the second dielectric layer, thereby forming a funnel-shaped opening between the first dielectric layer and the second dielectric layer and exposing the substrate; and forming a gate electrode in the funnel-shaped opening between the first dielectric layer and the second dielectric layer, wherein the funnel-shaped opening comprises a funnel slope of about 30° to about 45° relative to a major surface of the substrate.

14. The method of claim 13, further comprising forming a third dielectric layer over the substrate adjacent the first dielectric layer and the second dielectric layer.

15. The method of claim 13, wherein an upper portion the funnel-shaped opening extends about 4.5 nm to about 5 nm laterally from a lower portion of the funnel-shaped opening.

16. The method of claim 13, wherein the forming the first dielectric layer and the second dielectric layer comprises forming a first dielectric spacer adjacent the gate stack and a second dielectric spacer adjacent the first dielectric spacer, the first dielectric spacer being formed of a different material than the second dielectric spacer.

17. The method of claim 13, wherein the removing comprises: performing a first etch process having a first ratio of an etch rate of the gate stack to an etch rate of the first dielectric layer and the second dielectric layer; and performing a second etch process having a second ratio of an etch rate of the gate stack to an etch rate of the first dielectric layer and the second dielectric layer, the second ratio being greater than the first ratio.

18. The method of claim 17, wherein the first etch process comprises a dry etch process.

19. The method of claim 18, wherein the dry etch process uses a process gas of CF4, or CHF3.

20. The method of claim 17, wherein the second etch process comprises a dry etch process.

21. The method of claim 20, wherein the dry etch process uses a process gas such as Cl2 or HBr.

\* \* \* \* \*